(12) United States Patent
Tang et al.

(10) Patent No.: US 10,049,752 B1
(45) Date of Patent: Aug. 14, 2018

(54) METHOD AND APPARATUS FOR PROCESS CORNER COMPENSATION FOR MEMORY STATE SENSING

(71) Applicant: Intel Corporation, Santa Clara, CA (US)

(72) Inventors: Qiang Tang, Cupertino, CA (US); Kalyan C. Kavalipurapu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/450,183

(22) Filed: Mar. 6, 2017

(51) Int. Cl.
| | |
|---|---|
| *G11C 11/34* | (2006.01) |
| *G11C 16/06* | (2006.01) |
| *G11C 16/26* | (2006.01) |
| *G11C 16/04* | (2006.01) |
| *G11C 16/24* | (2006.01) |
| *G11C 16/10* | (2006.01) |

(52) U.S. Cl.
CPC .......... *G11C 16/26* (2013.01); *G11C 16/0483* (2013.01); *G11C 16/10* (2013.01); *G11C 16/24* (2013.01)

(58) Field of Classification Search
CPC ..... G11C 16/26; G11C 16/0483; G11C 16/10; G11C 16/24
See application file for complete search history.

(56) References Cited

U.S. PATENT DOCUMENTS

| | | | |
|---|---|---|---|
| 9,443,610 B1 * | 9/2016 | Pan ...................... | G11C 29/025 |
| 9,633,744 B2 * | 4/2017 | Kavalipurapu .... | G11C 16/3459 |
| 2016/0042799 A1 * | 2/2016 | D'Alessandro ........ | G11C 16/26 365/185.25 |
| 2017/0169867 A1 * | 6/2017 | Desai ...................... | G11C 7/12 |

OTHER PUBLICATIONS

U.S. Appl. No. 15/248,692.

* cited by examiner

*Primary Examiner* — Toan Le
(74) *Attorney, Agent, or Firm* — Alliance IP, LLC

(57) ABSTRACT

In one embodiment, an apparatus comprises a memory array; a sense circuit comprising a first transistor and a sense node coupled to the first transistor and selectively coupled to a memory cell of the memory array via a data line; and a tracking circuit comprising a second transistor having a threshold voltage that is to track a threshold voltage of the first transistor, the tracking circuit to generate at least one sensing parameter of the sense circuit based on the threshold voltage of the second transistor.

21 Claims, 8 Drawing Sheets

METHOD AND APPARATUS FOR PROCESS CORNER COMPENSATION FOR MEMORY STATE SENSING

FIELD

The present disclosure relates in general to the field of computer development, and more specifically, to memory sensing.

BACKGROUND

A computer system may include one or more central processing units (CPUs) that may be coupled to one or more storage devices. A CPU may include a processor to execute an operating system and other software applications that utilize the storage devices coupled to the CPU. The software applications may write data to the storage devices and read data from the storage devices. The data may be stored by the storage devices in a plurality of memory cells (e.g., NAND flash memory cells) of the storage devices.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
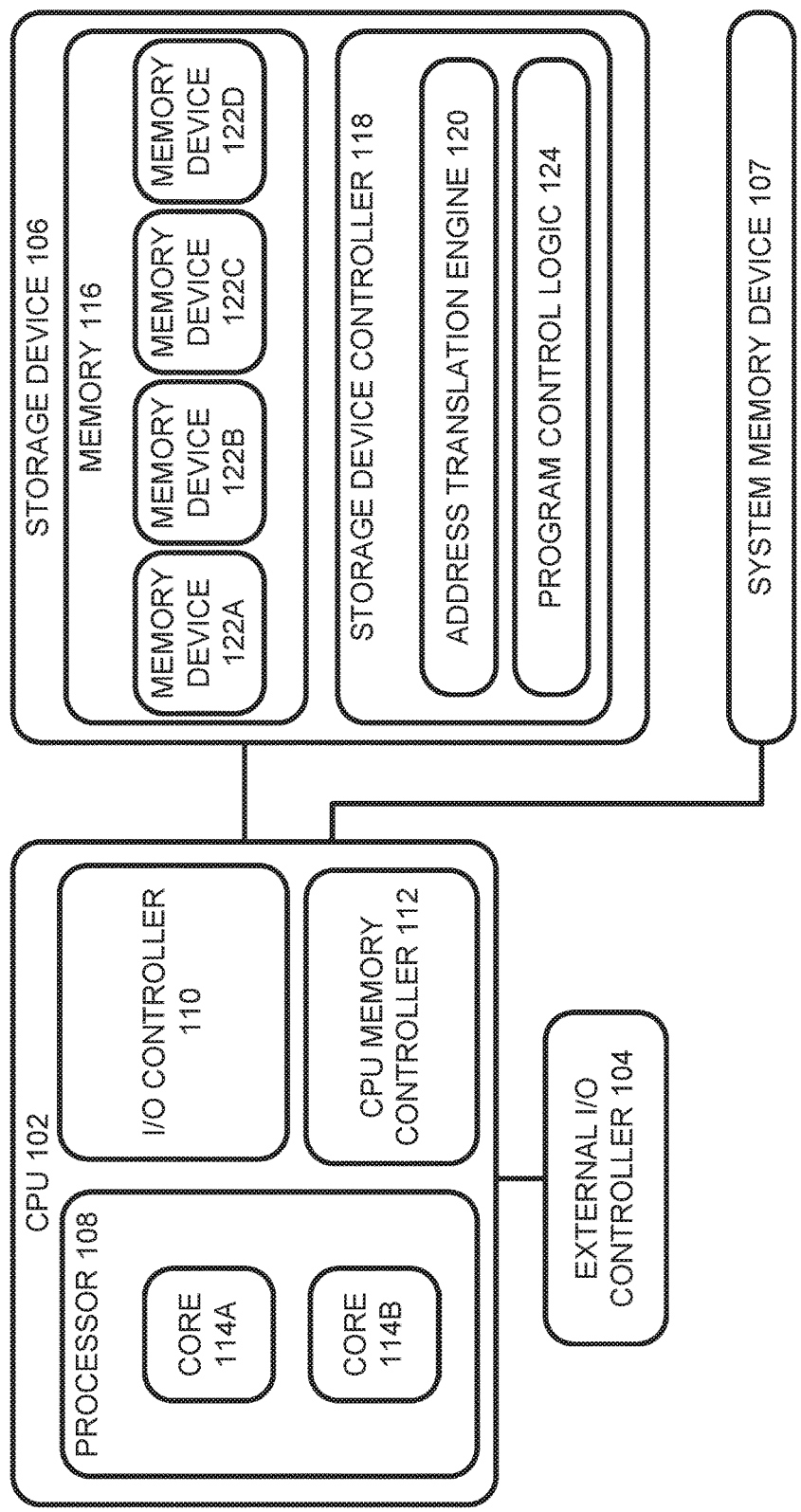
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, storage device 106, and system memory device 107. During operation, data may be transferred between storage device 106 or system memory device 107 and the CPU 102. In various embodiments, particular data operations (e.g., erase, program, and read operations) involving a storage device 106 or system memory device 107 may be managed by an operating system or other software application executed by processor 108.

Storage devices including flash memory arrays may be used in a wide range of electronic applications. Flash memory arrays typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data state (e.g., data value) of each memory cell.

Sensing (e.g., reading or verifying) a data state of a memory cell often involves detecting whether the memory cell is activated in response to a particular voltage or current applied to its control gate, such as by detecting whether a data line connected to the memory cell experiences a change in voltage level caused by current flow through the memory cell. Circuitry used to detect such changes in voltage level or current level are often affected by process variations. For example, sensing parameters (such as various voltages applied during the sensing operation or the amount of time allowed for a particular portion of the sense operation) that are optimal for a memory array on a first die may not be optimal for a memory array on a second die due to process corner variations. Temperature various may also affect the operation of the sensing circuitry. If these variations are not compensated for, inaccurate determination of the data states of sensed memory cells may result.

In various embodiments of the present disclosure, an indication of the effect of process variations and/or temperature variations on sensing circuitry may be determined and used during sensing operations to compensate for process corner variations and temperature variations. Various embodiments may provide technical advantages, such as improved sensing accuracy, a generally constant sense current, increased sensing margins, improved sensing linearity, and/or other technical advantages.

In various embodiments, a storage device 106 comprises NAND flash memory (herein a storage device comprising NAND flash memory is referred to as a NAND flash storage device). In some embodiments, storage device 106 may be a solid state drive; a memory card; a Universal Serial Bus (USB) flash drive; or memory integrated within a device such as a smartphone, camera, media player, vehicle, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 106 may include any number of memories 116 and each memory 116 may include any number of memory devices 122A-D. In the embodiment depicted, memory 116 includes memory devices 122A-D (while specific references herein may be made to memory device 122A, the other memory devices may have any suitable characteristics of memory device 122A).

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev 1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other device) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory array is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise executed by the cores 114A and 114B. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A memory device 122A includes a plurality of memory cells that are each operable to store one or more bits. The cells of a memory device 122A may be arranged in any suitable fashion, such as in rows (e.g., word lines) and columns (e.g., bit lines), three dimensional structures, and/or other manner. In various embodiments, the cells may be logically grouped into banks, blocks, sub-blocks, word lines, pages, frames, bytes, or other suitable groups. In various embodiments, a memory device 122A comprises one or more NAND flash memory arrays. NAND flash memory arrays are described in more detail in connection with FIG. 2.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

In a particular embodiment, a memory 116 is a semiconductor package. In various embodiments, a semiconductor package may comprise a casing comprising one or more semiconductor dies (also referred to as chips). A package may also comprise contact pins or leads used to connect to external circuits. In a particular embodiment, each memory device 122A is embodied on its own die. Accordingly, in some embodiments, a memory 116 may be a package that includes a plurality of dies that each include a memory device 122A. However, a package is merely one example form a memory 116 may take as a memory device may be any suitable arrangement of one or more memory arrays and associated logic in any suitable physical arrangement. For example, although a single physical package may include a single memory 116, multiple memories 116 could be resident on a single package or a memory 116 could be spread across multiple packages. As another example, a memory 116 may be embodied in one or more different physical mediums, such as a circuit board, die, disk drive, other medium, or any combination of thereof (or combination with one or more packages). Similarly, a die is merely one example of a component that may comprise a memory device 122A, as a memory device 122A may be any suitable arrangement of memory cells and logic associated with the memory cells. For example, although a single die may include a single memory device 122A, multiple memory arrays could be resident on a single die or a memory device 122A could be spread across multiple dies. As another example, a memory device 122A may be embodied in one or more different physical mediums, such as a circuit board, package, disk drive, other medium, or any combination of thereof (or combination with one or more dies). In a particular embodiment, memory 116 comprises a circuit board coupled to a plurality of memory devices 122 that each comprise a semiconductor package.

Storage device 106 may comprise any suitable type of memory and is not limited to a particular speed, technology, or form factor of memory in various embodiments. For example, a storage device 106 may be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory devices(s) thereof), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located (e.g., a logical unit number), one or more pages of the physical memory location, one or more subblocks of the physical memory location, one or more word lines of the physical memory location, one or more bit lines of the physical memory location, or other suitable identifiers or encodings thereof.

In various embodiments, the storage device 106 also includes program control logic 124 which is operable to control the programming sequence performed when data is written to a memory 116 or the read sequence performed when data is read from a memory 116. In various embodiments, program control logic 124 may provide the various voltages (or information indicating which voltages should be provided) that are applied to one or more memory cells, word lines, bit lines, and/or other portions of a memory array during the programming and/or reading of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
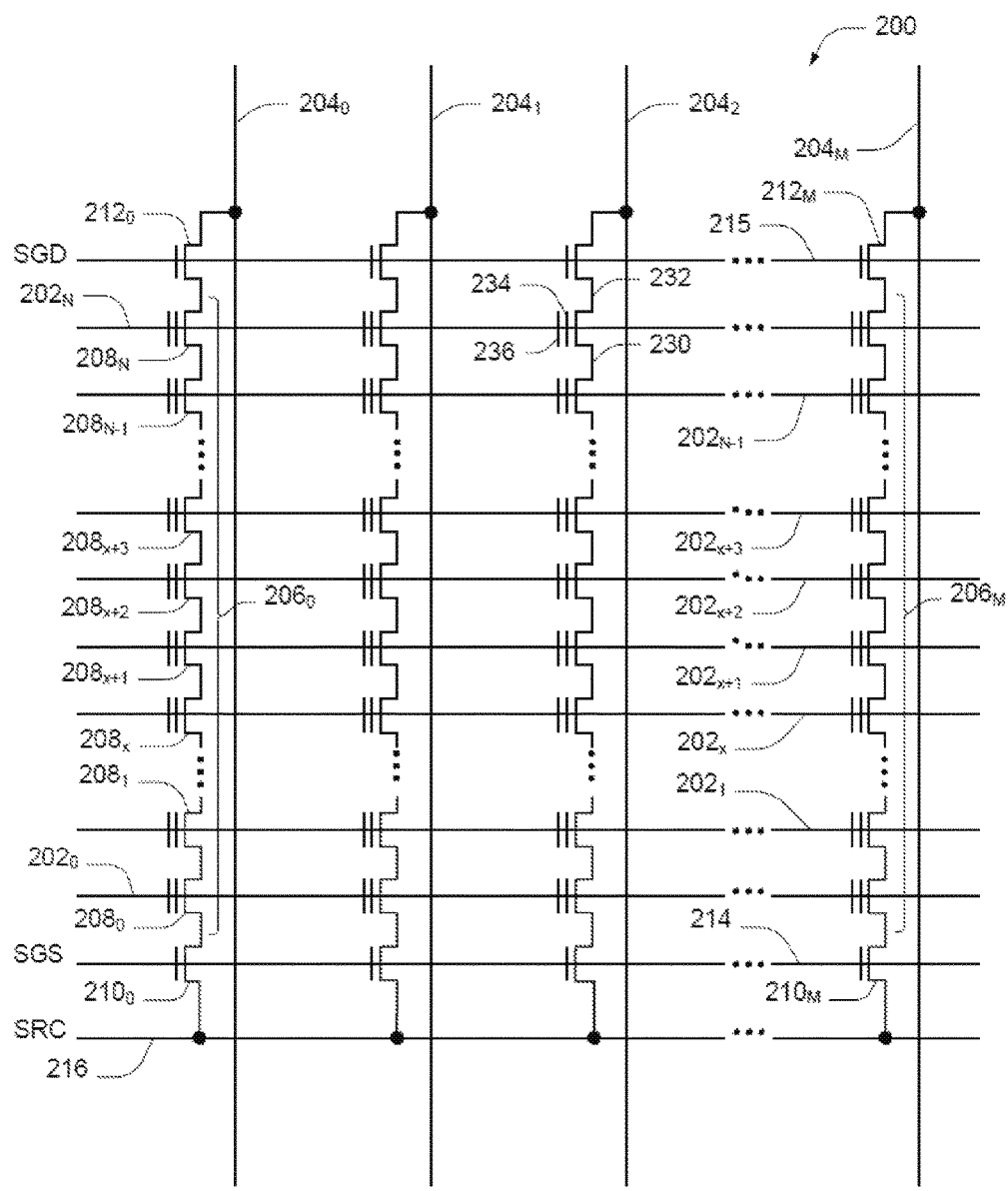
FIG. 2 illustrates an example portion of a NAND flash memory array in accordance with certain embodiments.

FIG. 2 illustrates an example portion of a NAND flash memory array 200 in accordance with certain embodiments. In various embodiments, memory device 122A includes an array 200 of memory cells logically arranged in rows and columns. Memory cells of a logical row are typically connected to the same access line (commonly referred to as a word line) while memory cells of a logical column are typically selectively connected to the same data line (commonly referred to as a bit line). In some embodiments, a single access line may be associated with more than one logical row of memory cells and a single data line may be associated with more than one logical column. Memory cells of the array are capable of being programmed to one of at least two data states.

Memory array 200 includes access lines, such as word lines $202_0$ to $202_N$, and data lines, such as bit lines $204_0$ to $204_M$. In some embodiments, the word lines 202 may be connected to global access lines (e.g., global word lines) in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 may be arranged in rows (each corresponding to a word line 202) and columns (each corresponding to a bit line 204). Each column may include a string of series-connected memory cells, such as one of NAND strings $206_0$ to $206_M$. Each NAND string 206 may be connected (e.g., selectively connected) to a common source 216 and may include a plurality of memory cells. For example, NAND string $206_0$ includes memory cells $208_0$ to $208_N$. The memory cells 208 represent non-volatile memory cells for storage of data. The memory cells 208 of each NAND string 206 may be connected in series between a select transistor 210 (e.g., a field-effect transistor), such as one of the select transistors $210_0$ to $210_M$ (e.g., that may each be a source select transistor, commonly referred to as select gate source), and a select transistor 212 (e.g., a field-effect transistor), such as one of the select transistors $212_0$ to $212_M$ (e.g., that may each be a drain select transistor, commonly referred to as select gate drain). Select transistors $210_0$ to $210_M$ may be commonly connected to a select line 214, such as a source select line, and select transistors $212_0$ to $212_M$ may be commonly connected to a select line 215, such as a drain select line.

A source of each select transistor 210 may be connected to common source 216. The drain of each select transistor 210 may be connected to a memory cell $208_0$ of the corresponding NAND string 206. For example, the drain of select transistor $210_0$ may be connected to memory cell $208_0$ of the corresponding NAND string $206_0$. Therefore, each select transistor 210 may be configured to selectively couple a corresponding NAND string 206 to common source 216. A control gate of each select transistor 210 may be connected to select line 214.

The drain of each select transistor 212 may be connected to the bit line 204 for the corresponding NAND string 206. For example, the drain of select transistor $212_0$ may be connected to the bit line $204_0$ for the corresponding NAND string $206_0$. The source of each select transistor 212 may be connected to a memory cell of the corresponding NAND string 206. For example, the source of select transistor $212_0$ may be connected to memory cell $208_N$ of the corresponding NAND string $206_0$. Therefore, each select transistor 212 may be configured to selectively connect a corresponding NAND string 206 to a corresponding bit line 204. A control gate of each select transistor 212 may be connected to select line 215.

The memory array in FIG. 2 may be a quasi-two-dimensional memory array and may have a generally planar structure, e.g., where the common source 216, NAND strings 206 and bit lines 204 extend in substantially parallel planes. Alternatively, the memory array in FIG. 2 may be a three-dimensional memory array, e.g., where NAND strings 206 may extend substantially perpendicular to a plane containing the common source 216 and to a plane containing the bit lines 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a word line 202.

A column of the memory cells 208 is one or more NAND strings 206 selectively connected to a given bit line 204. A row of the memory cells 208 are memory cells commonly connected to a given word line 202. A row of memory cells 208 may, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line 202N and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line may be deemed a physical page. The portion of a physical page (which, in some embodiments, could still be the entire row) that is read during a single read operation or programmed during a program operation (e.g., an upper or lower page of memory cells) may be deemed a logical page.

In sensing (e.g., reading) a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) may be applied to the control gate of memory cell $208_{x+1}$ while voltage levels are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. A sense operation that determines whether the memory cell $208_{x+1}$ is activated in response to one or sense voltages may indicate one or more bits of the data state stored in that memory cell.

Although the example of FIG. 2 is discussed in conjunction with NAND flash, the embodiments and concepts described herein are not limited to a particular array architecture or structure, and can include other structures (e.g., cross-point memory, DRAM, or other memories described herein) and other architectures (e.g., AND arrays, NOR arrays, etc.).

Figure 3:
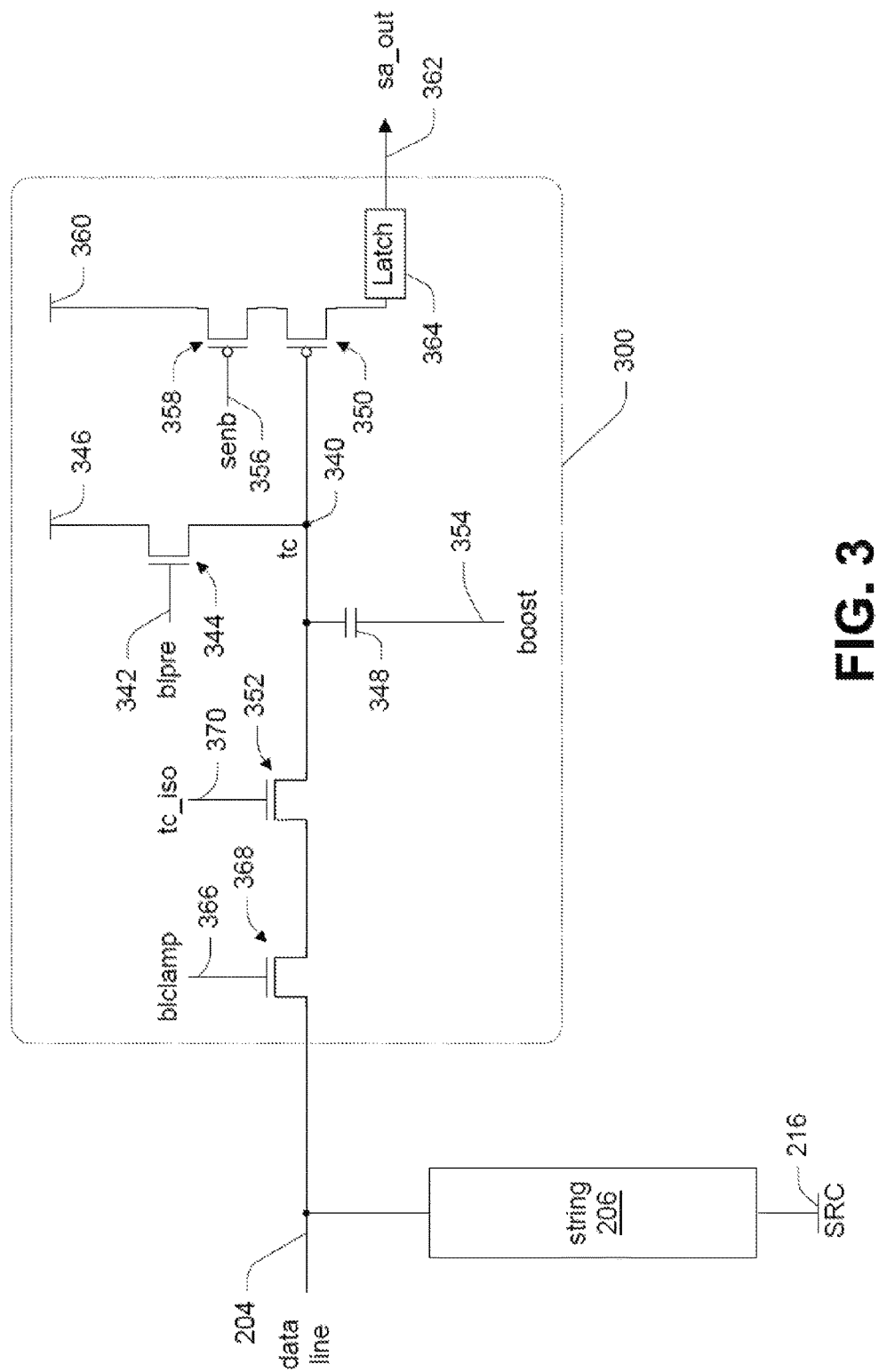
FIG. 3 illustrates an example sense circuit in accordance with certain embodiments.

Sense circuits are typically utilized in memory devices to facilitate performing a sense (e.g., read and/or verify) operation on each of one or more selected (e.g., target) memory cells in the memory device. FIG. 3 illustrates an example sense circuit 300 in accordance with certain embodiments. Sense circuit 300 is shown connected to a particular NAND string 206 by a particular data line 204. Note that select transistors 210 and 212 selectively connecting the NAND string 206 to the source 216 and data line 204, respectively, are not shown in FIG. 3. While this discussion is directed to use of the sense circuit 300 with a NAND string 206, other memory structures and architectures are suitable for use with sense circuit 300 where a current path can be selectively created from the data line 204 to the source 216 dependent upon a data state of a memory cell selected for sensing.

As part of a sense operation, e.g., during a precharge portion, the sense circuit 300 may precharge a sense node (e.g., tc node) 340 by activating a precharge transistor (e.g., n-type field effect transistor, or nFET) 344 by biasing (e.g., driving) the signal line 342 to a particular voltage level (e.g., a voltage level of control signal blpre) sufficient to activate the transistor 344.

Control signals of the sense circuit 300 may be provided by an internal controller of the memory device 122A. Such control signals (e.g., both voltage levels and timing) are defined by the sense operation and are distinguished from signals generated in response to performing the sense operation (e.g., the output signal sa_out or a voltage level generated on the sense node 340).

Transistor 344 is connected between a voltage node 346 and the sense node 340. Voltage node 346 may be configured to receive a supply voltage, e.g., Vcc. For some embodiments, voltage node 346 may be a variable voltage node. Voltage node 354 (e.g., a variable voltage node) is configured to apply a voltage level to the capacitance 348 which may induce a change in voltage level on the sense node 340, for example, to boost the sense node 340 to a higher voltage level, such as through capacitive coupling. Voltage node 354 may also be referred to herein as the "boost node." In various embodiments, capacitance 348 shown coupled to the sense node 340 may include a capacitor having a first end coupled to sense node 340 and a second end coupled to the boost node 354. In various embodiments, capacitance 348 may also be representative of diffusion capacitance coupled to the sense node (e.g., capacitance at the sense node 340 and additional circuitry connected to it, e.g., transistors 344, 350 and 352).

Additional transistors of the sense circuit facilitate sensing of a voltage level on the sense node 340. For example, the control gate of a sense transistor (e.g., p-type field effect transistor, or pFET) 350 is shown connected to the sense node 340. Thus, transistor 350 is configured to be responsive to a voltage level present on the sense node 340. Signal line 356, which is connected to the gate of a sense enable transistor (e.g., pFET) 358 and configured to receive control signal senb, facilitates isolating the transistor 350 from the voltage node 360, which may be configured to receive a supply voltage, e.g., Vcc. The sense circuit output (e.g., sa_out) line 362 may be connected to additional circuitry of the memory device configured to respond to the sense circuit 300 as part of a sensing operation. For example, the sense circuit 300 may be a component of a data register and its output sa_out may be provided as an input to a cache register for output of the sensed data state from the memory array 122A. The output signal sa_out on output line 362 may comprise a signal generated by a latch (e.g., latch circuit) 364 which is representative of a logic level, such as a logic 'high' (e.g., represented by Vcc) or logic 'low' (e.g., represented by Vss) level indicative of a sensed data state of a selected memory cell of NAND string 206, for example. As one example, latch 364 may be configured as a pair of cross-coupled inverters. For some embodiments, latch 364 may be omitted, and output line 362 may be connected to the transistor 350.

During a first portion of a sense operation (i.e., a "precharge period"), the gate of transistor 344 is biased by a voltage level (e.g., of control signal blpre) on signal line 342 to precharge the sense node 340 by injecting a precharge current into the sense node 340. In a particular embodiment, the sense node 340 is precharged to Vcc. An additional voltage level (e.g., of control signal blclamp) may be applied to signal line 366 to activate transistor (e.g., nFET) 368, and a further voltage level (e.g., of control signal tc_iso) may be applied to signal line 370 to activate transistor (e.g., nFET) 352. Activating transistors 344, 352 and 368 serves to connect data line 204 to the voltage node 346, thereby precharging the sense node 340 and the data line 204.

Following the precharging of the sense node 340 and the data line 204, a second portion of the sense operation is performed to detect whether or not the precharged data line 204 and sense node 340 is discharged during the sense operation, thereby determining the data state of the memory cell selected for sensing. In general, following the precharging of the sense node 340 and the data line 204, the sense node 340 may be isolated from the data line 204, such as by deactivating the transistor 368 and/or deactivating the transistor 352. The data line 204 is then selectively connected to the source 216 depending upon whether the memory cell selected for sensing is activated or deactivated in response to a sense voltage applied to its control gate.

After the data line 204 is given an opportunity to discharge if current is flowing through the NAND string 206, the sense node 340 may again be connected to the data line 204 by activating the transistors 352 and 368. If a voltage level of the data line 204 is lower than the precharge voltage level due to current flow through the NAND string 206, the voltage level of the sense node 340 will likewise experience a drop. If the voltage level of the data line 204 remains at the precharge voltage level, such as when the memory cell selected for sensing remains deactivated, the voltage level of the sense node 340 may remain at its precharge (or boosted) voltage level.

With the transistor 358 activated, and the voltage level of the sense node 340 applied to the control gate of the transistor 350, the voltage node 360 may be selectively connected to the latch 364 depending upon a voltage level of the sense node 340. The latch 364 may have a particular logic level (e.g., logic high) prior to sensing. If the voltage level of the voltage node 360 is applied to the input of the latch 364 upon activation of the transistor 358, its logic level may change, e.g., from a logic high level to a logic low level, and if the voltage node 360 remains isolated from the input of the latch 364 upon activation of the transistor 358, its logic level may remain at the particular logic level.

Various embodiments may utilize boosting and deboosting of the sense node 340 during the sense operation. Boosting (e.g., capacitively coupling a boost voltage level to) and deboosting (e.g., lowering the boost voltage level capacitively coupled to) the sense node 340 may be used, for example, to facilitate a higher develop overhead. By boosting the sense node 340 prior to the sense node develop time (e.g., after the initial precharge to Vcc), the voltage level of the sense node 340 can be allowed to develop longer without prematurely indicating current flow of the data line 204. Subsequent deboosting of the sense node 340 after the sense node develop time has elapsed permits the voltage level of the sense node 340 to drop below the trip point (e.g., threshold voltage) of the transistor 350 to indicate that current flow was detected. Boosting may also be applied to facilitate the sensing of memory cells with different characteristics. For example, because some memory cells may program faster than others, a boosting operation may be performed to compensate for such disparities to enhance the sensing operation. Boosting operations are described in more detail in connection with FIG. 4.

The trip point of the sense circuit 300 may generally be dependent upon the threshold voltage of the sense transistor 350. The sense circuit 300 is typically configured to have a trip point (e.g., sense threshold level) relatively close to the precharge voltage level (e.g., Vcc) that may be established on the sense node 340 prior to sensing the selected memory cell. The trip point may be a particular voltage level on the sense node 340 wherein the sense circuit 300 outputs a first logic level indicative of a first data state of a sensed selected memory cell when the voltage level of the sense node 340 is equal to or above the trip point. The sense circuit 300 may output a second logic level indicative of a second data state of the sensed selected memory cell when the voltage level of the sense node 340 is below the trip point, for example.

Figure 4:
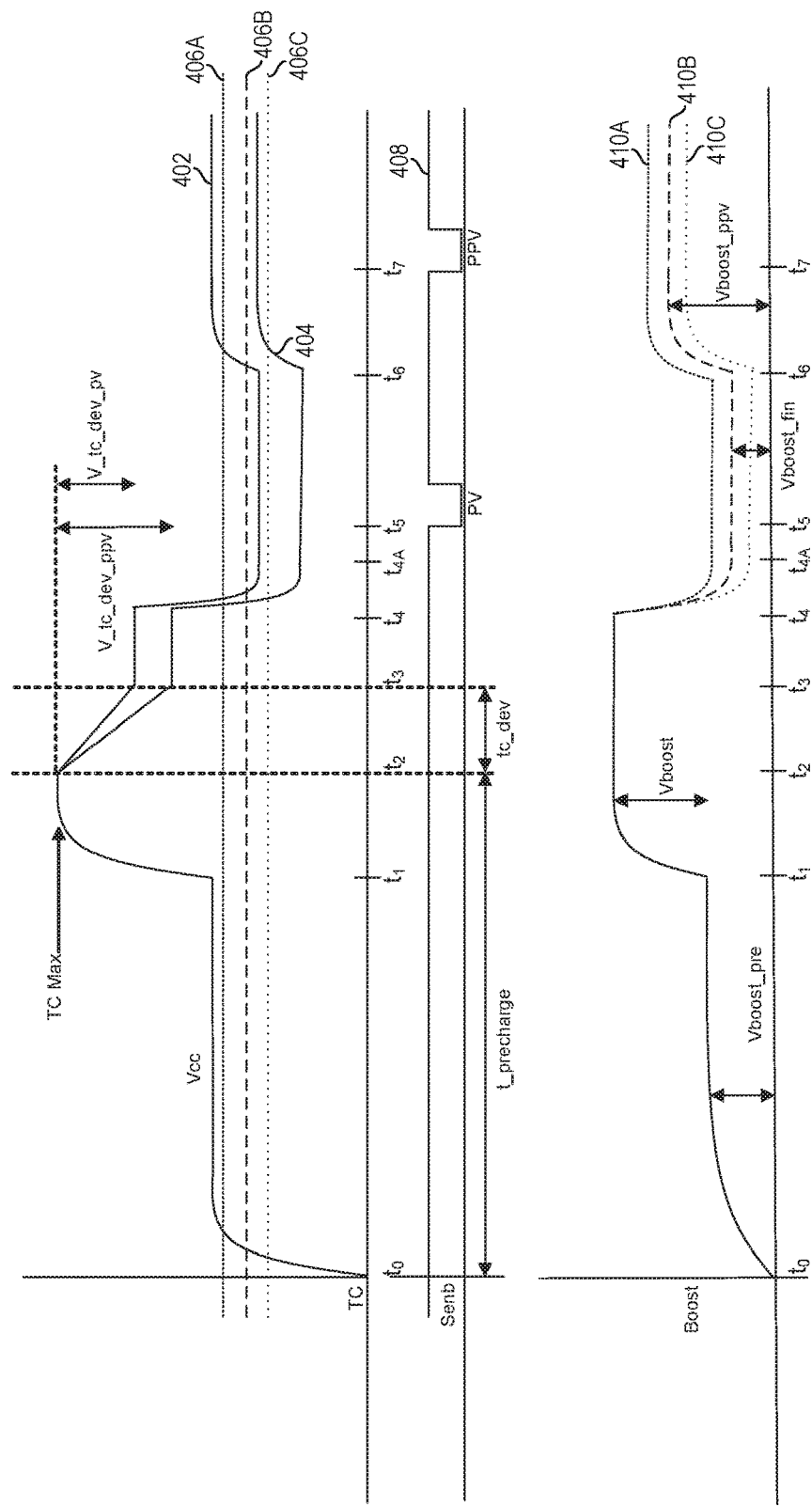
FIG. 4 illustrates example waveforms associated with a sensing operation in accordance with certain embodiments.

FIG. 4 illustrates example waveforms associated with a sensing operation in accordance with certain embodiments. Waveform 402 depicts the voltage waveform of a sense node (e.g., 340) of a first sensing circuit coupled to a slow developing cell (e.g., a PV cell) of the memory array 200 and waveform 404 depicts the voltage waveform of a sense node (e.g., 340) of a second sensing circuit coupled to a fast developing cell (e.g., a PPV cell) of the memory array 200.

As shown, these waveforms may (but are not required to) be identical up to time $t_2$. Even though the first cell and second cell are set to the same data state (i.e., they store the same data value(s), though they do not necessarily have the exact same threshold values), they may program and develop at different rates. As shown, during the develop time (i.e., tc_dev), the first cell develops slower than the second cell. In various embodiments, during programming, relatively lower program voltages may be applied to the PPV cells (as compared to the program voltages applied to the PV cells) so as not to program the PPV cells beyond their target program levels.

The various lines 406A-C depict various values of Vcc-Vtp for different process corners (where Vtp represents a typical gate threshold voltage of a pFET sense transistor, e.g., transistor 350, fabricated using a particular process corner). For example, line 406A represents Vcc-Vtp for a fast-fast (FF) corner process, line 406B represents Vcc-Vtp for a typical-typical (TT) corner process, and line 406C represents Vcc-Vtp for a slow-slow (SS) corner process. Thus, a sense transistor fabricated using a TT corner process will have a higher threshold voltage than a sense transistor fabricated using a FF corner process, but a lower threshold voltage than a sense transistor fabricated using a SS corner process. If the trip point (e.g., threshold voltage of transistor 350) is not accounted for (e.g., by correctly biasing the sense node 340) during the sense operation, an erroneous indication of the data state of the memory cell may result.

Waveform 408 depicts the timing of the activation of a signal (e.g., senb 356) to allow sensing by a sense transistor (e.g., 350) for a PV cell and a PPV cell. For example, senb 356 of the sensing circuit is activated at time $t_5$ for PV cell sensing and activated again at time $t_7$ for PPV cell sensing (e.g., fast cells may respond to the PPV senb activation while slow cells do not). Waveforms 410A-C depict example voltage waveforms of a boost node (e.g., 354) that is capacitively coupled to a sense node (e.g., 340). Waveform 410A illustrates a boost waveform voltage for a FF corner process, 410B illustrates a boost waveform voltage for a TT corner process, and 410C illustrates a boost waveform voltage for a SS corner process. As shown, these waveforms may (but are not required to) be identical up to time $t_4$.

A precharge portion of the sense operation may begin at time t0 by biasing control signals blpre, blclamp and tc_iso to voltage levels sufficient to activate transistors 344, 368 and 352, thereby connecting the sense node 340 to the voltage node 346 and the data line 204. In response, waveforms 402 and 404 increase (waveforms 402 and 404 are depicted as identical until the develop time begins). In the embodiment depicted, the waveforms (corresponding to sense nodes 340 associated with the first and second memory cells) increase to, e.g., Vcc. During the precharge portion, the boost node 354 is also biased to a voltage level Vboost_pre. After the sense node has reached the precharge voltage level (e.g., Vcc), the sense node 340 may be isolated from the data line 204 and the voltage node 346, such as by biasing control signals blpre and blclamp to voltage levels sufficient to deactivate the transistors 344 and 368.

At time t1, the sense node 340 is boosted by some particular voltage level above the precharge voltage level, such as by applying a boost voltage (e.g., Vboost+Vboost_pre) to the boost node 354. The sense node 340 then reaches a boosted voltage level (e.g., TC Max).

Between time t1 and time t2, the data line 204 is selectively connected to the source 216 depending upon whether the memory cell selected for sensing is activated or not in response to application of the sense voltage (e.g., to the gate of the memory cell) and is allowed to discharge if connected. At time t2, the sense node 340 is again connected to the data line 204 and, if the data line 204 has discharged in response to application of the sense voltage, the voltage of the sense node 340 will decrease. For example, in FIG. 4, both waveforms 402 and 404 decrease (i.e., develop) from time $t_2$ to time $t_3$. The time period between time $t_2$ and $t_3$ of FIG. 4, i.e., the time during which the sense node 340 is connected to and allowed to equilibrate with the data line 204 after the data line has been connected to the memory cell selected for sensing, may be referred to as the sense node develop time. In various embodiments, the develop time is adjustable and is selected so as to limit the discharge of the memory cell so that the voltage of the sense node 340 does not drop below the voltage of the boost node 354 for fast cells (e.g., PPV cells), so as to avoid non-linearity factors resulting from a negative voltage across capacitance 348.

At time $t_4$, after the sense node 340 has been connected to, and subsequently isolated from, the data line 204, the sense node 340 is deboosted, reaching a deboosted voltage level at time t4a. In a particular embodiment, such deboosting may be accomplished by dropping the voltage level applied to the boost node 354 from Vboost_pre+vboost to Vboost_fin. In various embodiments and as depicted, different values of Vboost_fin may be used for different process corners (the generation of the particular value of Vboost_fin is discussed in more detail below). At time $t_5$, if the memory cell is a PV memory cell, the transistor 350 of the sense circuit is connected to the voltage node 360 (e.g., by activating transistor 358), thereby generating the output signal sa_out with a logic level (e.g., voltage level) indicative of whether the waveform 402 has fallen below the trip point (which is dependent on the process corner), and thus indicative of the data state of the memory cell being sensed.

At time $t_6$, the sense node 340 is boosted by some particular voltage level above the Vboost_fin level, such as by applying a boost voltage (e.g., Vboost_ppv) to the voltage node 354. The sense node 340 then reaches a boosted voltage level. For a sense circuit sensing a PPV cell, this may bring the voltage level of the sense node 340 back into a range in which the data state may be accurately sensed.

At time $t_7$, if the memory cell is a PPV memory cell, the transistor 350 is connected to the voltage node 360 (e.g., by activating transistor 358), thereby generating the output signal sa_out with a logic level (e.g., voltage level) indicative of whether the waveform 404 is below the trip point (which is dependent on the process corner), and thus indicative of the data state of the memory cell being sensed.

As described above, a threshold voltage of a sense transistor (e.g., pFET transistor 350) may vary based on process corner and temperature. In various embodiments, a tracking circuit may comprise a tracking transistor that tracks the threshold voltage of the sense transistor. For example, the tracking transistor may have one or more parameters (e.g., width, length, surroundings such as distance and size of neighboring transistors, and orientation of poly and diffusion layers) in common with the sense transistor such that the threshold voltage of the tracking transistor provides an approximation of the threshold voltage of the sense transistor. For example, for a particular process corner, the threshold voltage of the tracking transistor may be approximately the same as the threshold voltage of the sense transistor. As another example, the threshold voltage of the tracking transistor and the threshold voltage of the sense transistor may similarly scale (e.g., the same amount in rise in temperature may lead to the same amount of change in the threshold voltages).

In various embodiments, the tracking circuit may sense the threshold voltage of the tracking transistor and generate at least one sensing parameter of one or more sense circuits (e.g., sense circuit 300 or other sense circuit that senses the data state of a memory cell) based on the threshold voltage of the tracking transistor. In a particular embodiment, a tracking circuit may generate a sensing parameter that is used by each sense circuit of a memory device 122A. Any suitable parameters may be generated by the sense circuit. For example, Vboost_pre, Vboost, Vboost_fin, Vboost_ppv, and/or tc_dev may be generated by the sense circuit. In various embodiments, any one or more of these parameters may be fixed across various process corners and temperatures while one or more of the remaining parameters are generated based on the threshold voltage of the tracking transistor.

Figure 5:
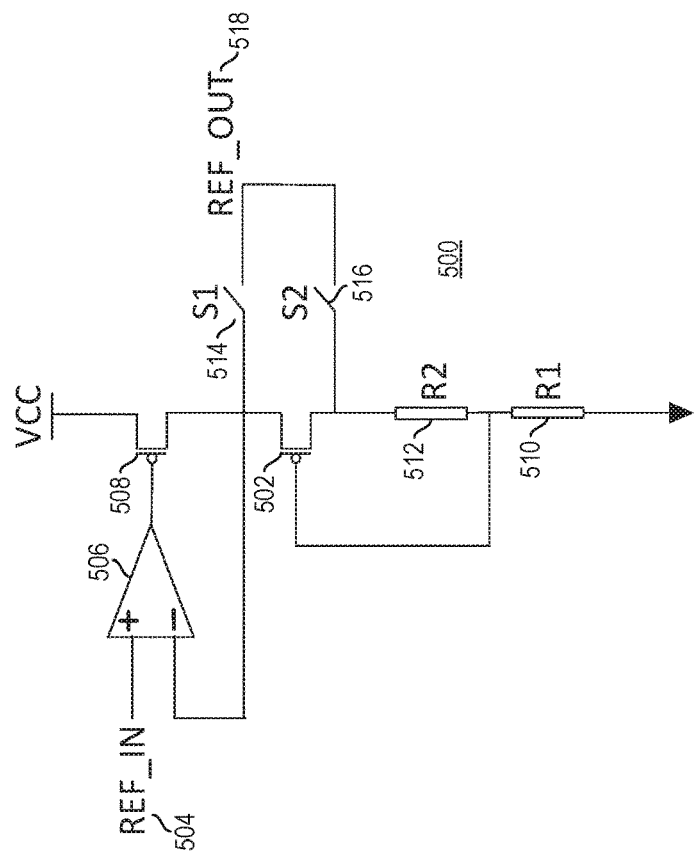
FIG. 5 illustrates a portion of an example tracking circuit in accordance with certain embodiments.

FIG. 5 illustrates a portion of an example tracking circuit 500 in accordance with certain embodiments. Tracking circuit 500 generates a sensing parameter voltage based on the threshold voltage of a tracking transistor 502. Tracking circuit 500 includes tracking transistor 502, operational amplifier 506, transistor 508, resistors 510 and 512, and switches 514 and 516. Tracking circuit 500 generates an output voltage REF_OUT 518 based on the input voltage REF_IN 504, the threshold voltage (i.e., Vtp) of tracking transistor 502 (which may be a pFET), and a boost ratio BR=R1/(R1+R2) dependent on the values of resistors 510 and 512. In a particular embodiment, the boost ratio is implemented so as to match a boost ratio of sense circuit 300 (i.e., the ratio of a change in voltage of the sense node 340 to a change in voltage of the boost node 354). In other embodiments, the boost ratio is implemented based on the desired magnitude of adjustment of the input voltage REF_IN 504. For example, one or both of resistors 510 and 512 may be adjustable resistors that may be set to effectuate the desired boost ratio.

As depicted, the positive terminal of amplifier 506 is coupled to REF_IN 504. Due to the feedback loop, the potential at the negative terminal of amplifier 506 is also at REF_IN. Accordingly, the potential at the source of tracking transistor 502 is also REF_IN and the potential at the gate of tracking transistor 502 is REF_IN−Vtp. In accordance with the voltage divider formed by R1 and R2, when switch 516 is closed and switch 514 is open, REF_OUT 518 is set to (REF_IN−Vtp)/BR. Thus, tracking circuit 500 may reduce an input reference voltage by an amount based on the magnitude of Vtp of tracking transistor 502 and the boost ratio. In a particular embodiment, the output of tracking circuit 500 is applied to the boost node 354 as Vboost_fin shown in FIG. 4, though it could be used to supply any one or more of the sensing parameters of the sense circuit 300.

Figure 6:
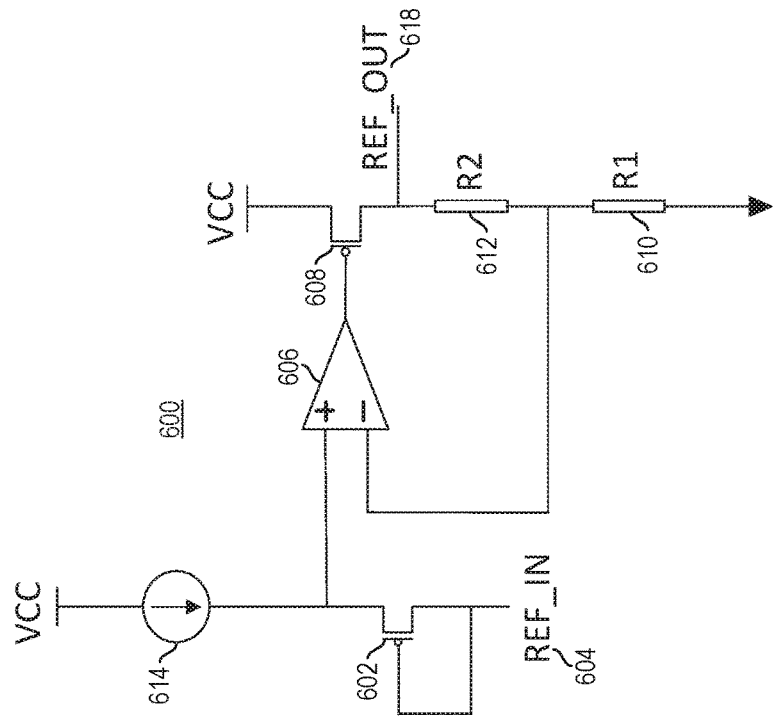
FIG. 6 illustrates a portion of an example tracking circuit in accordance with certain embodiments.

FIG. 6 illustrates a portion of an example tracking circuit 600 in accordance with certain embodiments. Tracking circuit 600 is to generate a sensing parameter voltage based on the threshold voltage of a tracking transistor 602. Tracking circuit 600 includes tracking transistor 602, operational amplifier 606, transistor 608, resistors 610 and 612, and current source 614. Tracking circuit 600 generates an output voltage REF_OUT 618 based on the input voltage REF_IN 604, the threshold voltage Vtp of tracking transistor 602, and a boost ratio BR=R1/(R1+R2) dependent on the values of resistors 610 and 612. In a particular embodiment, the boost ratio is implemented so as to match a boost ratio of sense circuit 300. In other embodiments, the boost ratio is implemented based on the desired magnitude of adjustment of the input voltage REF_IN 604. For example, one or both of resistors 610 and 612 may be adjustable resistors that may be set to effectuate the desired boost ratio.

As depicted, both the gate and the drain of tracking transistor 602 are coupled to REF_IN 604. This results in the source of the tracking transistor 602 (and the positive terminal of amplifier 606) being set to REF_IN+Vtp, where Vtp is the threshold voltage of the tracking transistor 602. Due to the feedback loop, the potential at the negative terminal of amplifier 606 is also set to REF_IN+Vtp. In accordance with the voltage divider formed by R1 and R2, REF_OUT 518 is set to (REF_IN+Vtp)/BR, where BR=R1/(R1+R2). Thus, tracking circuit 600 may increase an input reference voltage by an amount based on the magnitude of Vtp of tracking transistor 602 and the boost ratio. In a particular embodiment, the output of tracking circuit 600 is applied to the boost node 354 as Vboost_pre shown in FIG. 4, though it could be used to supply any one or more of the sensing parameters of the sense circuit 300.

Figure 7:
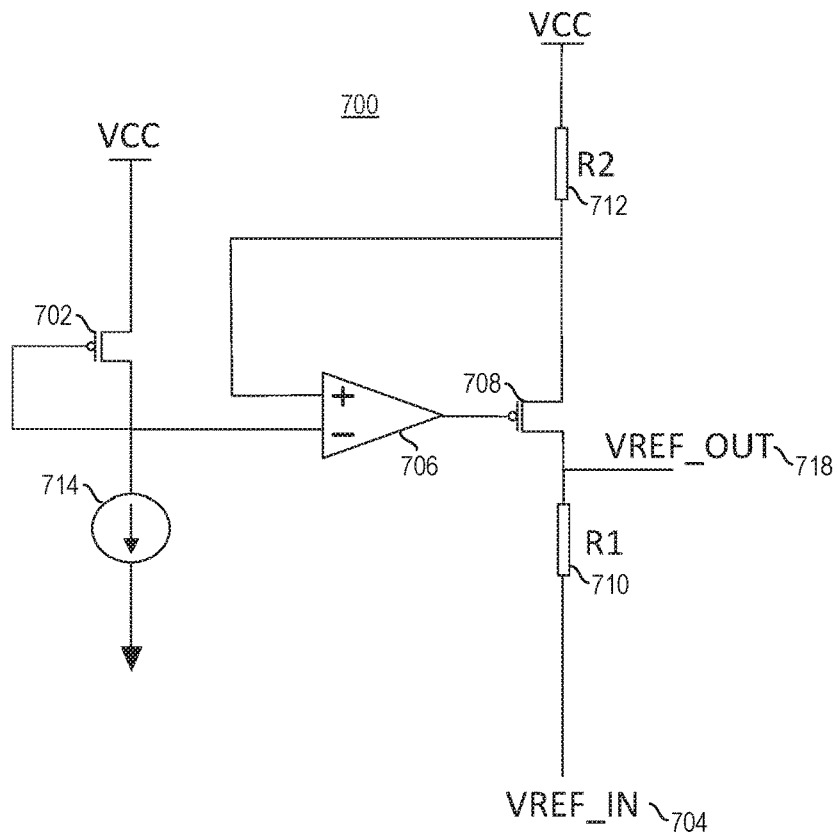
FIG. 7 illustrates a portion of an example tracking circuit in accordance with certain embodiments.

FIG. 7 illustrates a portion of an example tracking circuit 700 in accordance with certain embodiments. Tracking circuit 700 is to generate a sensing parameter voltage based on the threshold voltage of a tracking transistor 702. Tracking circuit 700 includes tracking transistor 702, operational amplifier 706, transistor 708, resistors 710 and 712, and current source 714. Tracking circuit 700 generates an output voltage REF_OUT 718 based on the input voltage REF_IN 704, the threshold voltage Vtp of tracking transistor 702, and the values of resistors 710 and 712 (i.e., R1 and R2). In various embodiments, the values of R1 and R2 are implemented based on the desired magnitude of adjustment of the input voltage REF_IN 704. For example, one or both of resistors 710 and 712 may be adjustable resistors that may be set to effectuate the desired boost ratio.

As depicted, both the gate and the drain of tracking transistor 702 are coupled to current source 714. Because the source is coupled to Vcc, the gate and drain of tracking transistor 702 as well as the negative terminal of amplifier 706 are set to a potential of Vcc−Vtp, where Vtp is the threshold voltage of the tracking transistor 702. Due to the feedback loop, the potential at the positive terminal of amplifier 706 is also set to Vcc−Vtp. Because one terminal of resistor 712 is at Vcc and the other terminal is at Vcc−Vtp, the voltage drop across resistor 712 is Vtp. Accordingly, the current across resistor 712 is Vtp/R2. This same current flows across R1 resulting in a voltage drop across R1 of (Vtp/R2)*R1. Accordingly, the potential at VREF_OUT equals VREF_IN+(Vtp/R2)*R1. Thus, tracking circuit 700 may increase an input reference voltage by an amount based on the magnitude of Vtp of tracking transistor 702 and the resistor values R1 and R2. In a particular embodiment, the output of tracking circuit 700 is applied to the boost node 354 as Vboost_pre shown in FIG. 4, though it could be used to supply any one or more of the sensing parameters of the sense circuit 300.

In various embodiments, a tracking circuit may be reconfigurable such that it may increase or decrease an input reference voltage to produce a sensing parameter voltage that may be applied to sense circuit 300 (e.g., at the boost node 354). For example, a tracking circuit may implement two or more of tracking circuits 500, 600, or 700 (or other tracking circuit). The particular relationship between the input voltage and the resulting output voltage may be determined based on the current configuration of the tracking circuit. In a particular embodiment, the same components may be used in multiple different configurations of the tracking circuit. In a particular embodiment, the tracking circuit may be configured using a plurality of switches. For example, for a particular setting of the switches, the tracking circuit may be configured as shown in FIG. 5 and for another setting of the switches the tracking circuit may be configured as shown in FIG. 6 or FIG. 7 (thus in some embodiments, tracking transistors 502, 602, and/or 702 may refer to the same tracking transistor and operational amplifiers 506, 606, and/or 706 may refer to the same operational amplifier used in multiple different configurations).

In a particular embodiment, a tracking circuit may be used to adjust Vboost_pre from a nominal value (e.g., a reference voltage input to the tracking circuit), while other sense parameters (e.g., Vboost, Vboost_fin, and Vboost_ppv) are held at nominal values (i.e., are not adjusted based on the threshold voltage of a tracking transistor). In another embodiment, a tracking circuit may be used to adjust Vboost_fin from a nominal value (e.g., a reference voltage input to the tracking circuit), while other sense parameters (e.g., Vboost_pre, Vboost, and Vboost_ppv) are held at nominal values (i.e., are not adjusted based on the threshold voltage of a tracking transistor). In another embodiment, one or more tracking circuits may be used to adjust both Vboost_pre and Vboost_fin based on a threshold voltage of a tracking transistor.

Figure 8:
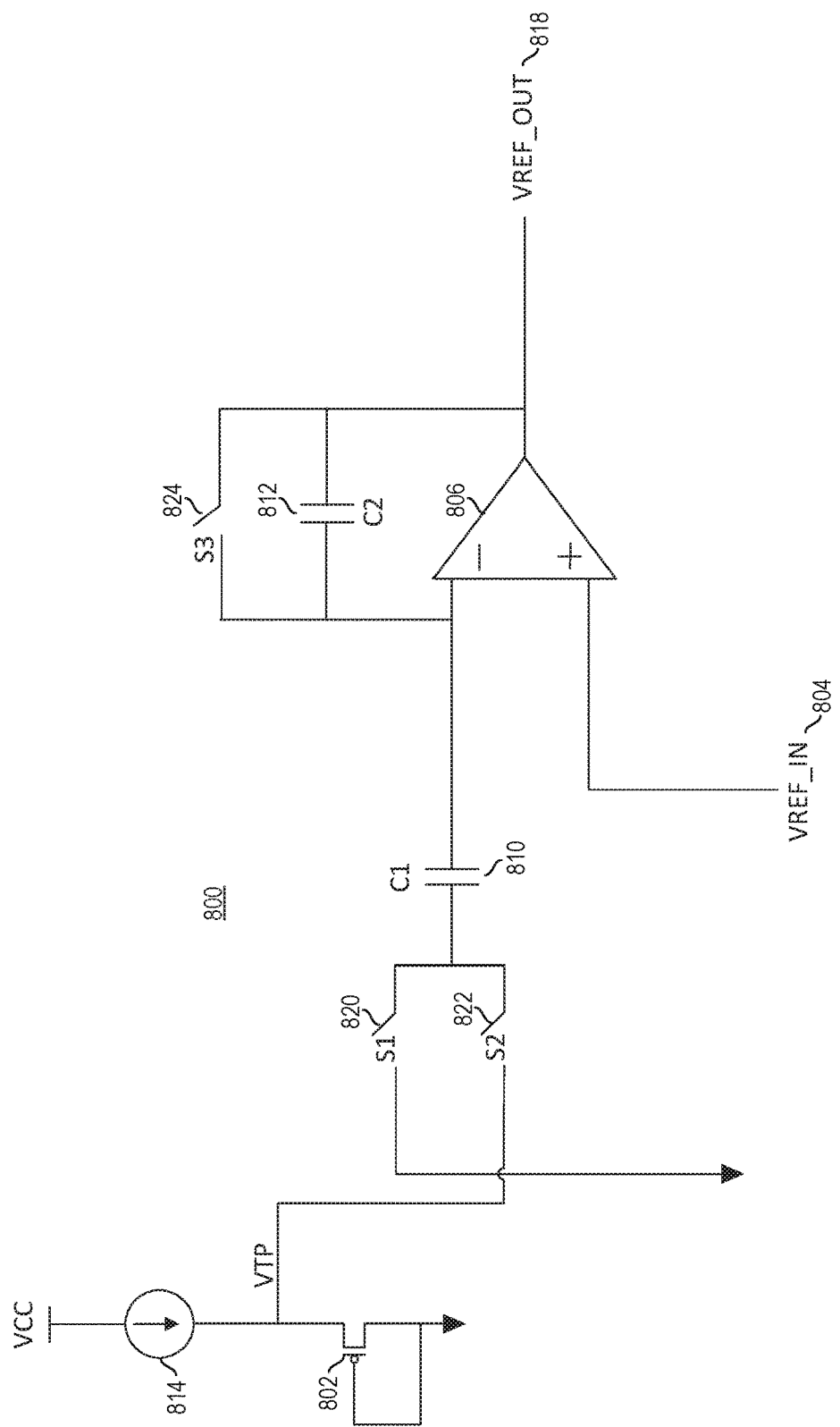
FIG. 8 illustrates a portion of an example tracking circuit in accordance with certain embodiments.

FIG. 8 illustrates a portion of an example tracking circuit 800 in accordance with certain embodiments. Tracking circuit 800 is to generate a sensing parameter voltage based on the threshold voltage of a tracking transistor 802 and a configuration of the tracking circuit 800. Tracking circuit 800 includes tracking transistor 802, operational amplifier 806, capacitors 810 and 812, and switches 820, 822, and 824. Tracking circuit 800 generates an output voltage VREF_OUT 818 based on the input voltage REF_IN 804, the threshold voltage Vtp of tracking transistor 802, the values C1 and C2 of capacitors 810 and 812, and the configuration of switches 820, 822, and 824.

In this embodiment, when switch 824 is closed and switches 820 and 822 are open, VREF_OUT=VREF_IN. When switch 824 is open, switch 820 is closed first, and switch 822 is closed second, VREF_OUT=VREF_IN+Vtp*(C1/C2). When switch 824 is open, switch 822 is closed first, and switch 824 is closed second, VREF_OUT=VREF_IN−Vtp*(C1/C2).

Thus, tracking circuit 800 may pass through, reduce, or increase an input reference voltage based on its particular configuration. In a particular embodiment, the output of tracking circuit 800 is applied to the boost node 354 as Vboost_pre and/or Vboost_fin shown in FIG. 4, though it could be used to supply any one or more of the sensing parameters of the sense circuit 300. For example, tracking circuit 800 may be configured to output VREF_IN+Vtp*(C1/C2) as Vboost_pre and output VREF_IN−Vtp*(C1/C2) as Vboost_fin.

Figure 9:
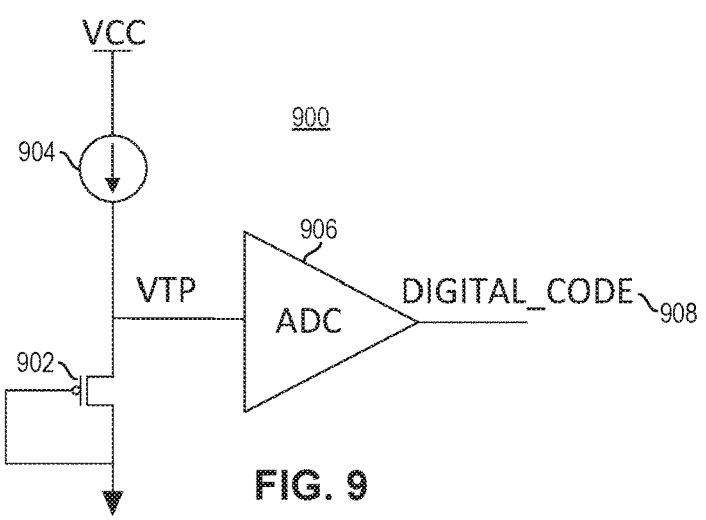
FIG. 9 illustrates a portion of an example tracking circuit in accordance with certain embodiments.

FIG. 9 illustrates a portion of an example tracking circuit 900 in accordance with certain embodiments. Tracking circuit 900 is to generate one or more sensing parameters (such as those listed above or other sensing parameters) based on the threshold voltage of a tracking transistor 902. Tracking circuit 900 includes a tracking transistor 902 with its gate and drain coupled to ground and its source coupled to current source 904. Accordingly, the potential of the source of the tracking transistor 902 is Vtp. The source of tracking transistor 902 is also coupled to an analog-to-digital converter (ADC) 906 which generates a digital value (DIGITAL_CODE 908) representing the value of Vtp.

The remainder of the tracking circuit 900 (not shown) may generate a sensing parameter based on the digital code 908. For example, Vboost_pre may be scaled up and/or Vboost_fin may be scaled down with rising values of digital code 908. In various embodiments, the digital code 908 may be used in conjunction with a nominal value for a sensing parameter to adjust the parameter based on the threshold voltage of the tracking transistor (e.g., the amount of adjustment from the nominal value may be dependent on the threshold voltage). In some embodiments, a sense parameter may be calculated as a function of Vtp divided by the boost ratio. As another example, the digital code 908 may be used to generate the length of the develop time (tc_dev). For example, tc_dev may be decreased as Vtp rises (and vice versa). In a particular embodiment, an amount of adjustment to tc_dev may be determined as a function of a delta in Vtp times the capacitance value of boost capacitance 348.

Various embodiments of the present disclosure provide particular benefits over previous sensing techniques. Particular embodiments may remove the impact from process corner variation and temperature variation, so V_tc_dev_pv (i.e., development of the PV cells) can be significantly reduced without affecting sensing accuracy. This may allow a larger voltage drop to be allocated to V_tc_dev_ppv (i.e., development of the PPV cells), or the sensing capacitor can be kept in a higher Vgs region (i.e., a positive voltage delta across the capacitor), thus yielding better linearity for sensing. A larger V_tc_dev_ppv indicates a higher PV-PPV delta. This implies that the window for detection of fast to program cells may be increased in various embodiments. Particular embodiments may result in a more constant cell current sensed across various process corners (cell currents that vary across temperature and process corners may cause more sensing errors or more difficult silicon process and a higher VpassR which leads to more read disturb and more power consumed).

Figure 10:
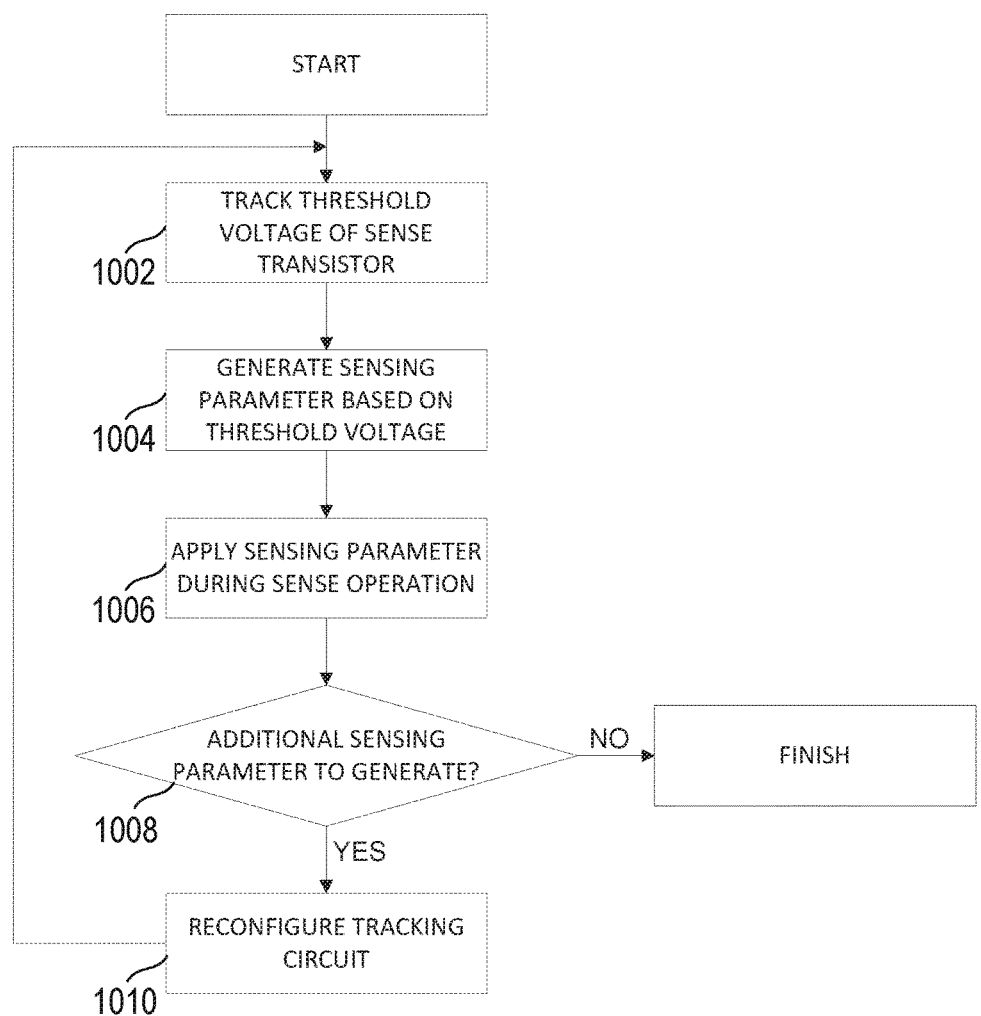
FIG. 10 illustrates an example flow for generating sensing parameters in accordance with certain embodiments.

FIG. 10 illustrates an example flow 1000 for generating sense parameters in accordance with certain embodiments. The flow 1000 depicts example operations that may be performed by any suitable logic, such as a storage device 106, a storage device controller 118, a memory device 122A, a memory array 200, a tracking circuit, and/or a sense circuit 300.

At 1002, the threshold voltage of a sense transistor is tracked. For example, the threshold voltage of the sense transistor may be tracked by monitoring the threshold voltage of a tracking transistor with similar characteristics to the sense transistor. At 1004, a sensing parameter is generated based on the tracked threshold voltage. For example, the sensing parameter may be a voltage that is to be applied to a boost node 354 or the time over which the memory cells are allowed to develop (i.e., develop time).

At 1006, the sensing parameter is applied during a sense operation. At 1008, a determination is made as to whether an additional sensing parameter is to be generated. If an additional sensing parameter is not to be generated, the method ends. If an additional sensing parameter is to be generated, a tracking circuit may be reconfigured at 1010. For example, this may include closing one or more switches and/or opening one or more switches in order to configure the tracking circuit to generate a different sensing parameter. At 1002, the threshold voltage is again tracked. For example, the threshold voltage of the same tracking transistor (that was utilized during the previous iteration of 1002) may be determined (or the previous determination of the threshold voltage may be stored in memory and reused). At 1004 an additional sensing parameter may be generated based on the threshold voltage and then applied at 1006. The flow may then continue to 1008 and end if no additional parameters are to be generated.

In one example, during the first iteration, a tracking circuit may generate a Vboost_pre voltage that is applied to the boost node 354 during a sense operation. During the second iteration the same tracking circuit may be reconfigured to generate a Vboost_fin voltage that is applied to the boost node 354 during the sense operation.

The flow described in FIG. 10 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 10 may be repeated, combined, modified or deleted where appropriate. Additionally, operations may be performed in any suitable order without departing from the scope of particular embodiments.

Although various embodiments have been described with respect to a particular type of memory array (e.g., a NAND flash memory array), the teachings of the various embodiments may be equally applicable to any type of memory arrays, including those recited herein or similar memory arrays. Although a particular type of sensing transistor has been described (e.g., a pFET), the teachings of the various embodiments may be equally applicable to other types of transistors (e.g., an nFET). Moreover, although various embodiments have been described with respect to voltage sensing to determine the state of a memory cell, the teachings of the various embodiments may be equally applicable to other types of sensing used to determine the state of a memory cell (e.g., current sensing).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any functionality of the various components such as CPU 102, external I/O controller 104, processor 108, cores 114A and 114B, I/O controller 110, CPU memory controller 112, storage device 106, system memory device 107, memory 116, memory devices 122A-D, storage device controller 118, address translation engine 120, program control logic 124, memory array 200, sense circuit 300, a tracking circuit, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprising a memory array; a sense circuit comprising a first transistor, and a sense node coupled to the first transistor and selectively coupled to a memory cell of the memory array via a data line; and a tracking circuit comprising a second transistor having a threshold voltage that is to track a threshold voltage of the first transistor, the tracking circuit to generate at least one sensing parameter of the sense circuit based on the threshold voltage of the second transistor.

In an embodiment, the memory cell is a NAND flash memory cell. In an embodiment, the first transistor is a P type field effect transistor to sense the data state of the memory cell. In an embodiment, the sense circuit further comprises a capacitor having a first end coupled to the sense node and a second node coupled to an adjustable bias voltage. In an embodiment, the at least one sensing parameter comprises a voltage applied to the sense circuit during a portion of a precharge period. In an embodiment, the at least one sensing parameter comprises a voltage applied to the sense circuit to deboost the sense node. In an embodiment, the at least one sensing parameter comprises a first voltage applied to the sense circuit over a first period of time and a second voltage applied to the sense circuit over a second period of time. In an embodiment, the tracking circuit is further to determine a digital code representing the threshold voltage of the second transistor and to generate the at least one sensing parameter of the sense circuit based on the digital code. In an embodiment, the at least one sensing parameter comprises a length of a develop time between a coupling of the sense node to a data line and a decoupling of the sense node from the data line. In an embodiment, the tracking circuit further comprises a voltage divider to generate a sense parameter of the at least one sense parameter.

In at least one embodiment, a method comprises sensing, by a tracking circuit, a threshold voltage of a first transistor, the first transistor tracking a threshold voltage of a second transistor selectively coupled to a memory cell of the memory array via a data line; generating, by the tracking circuit, at least one sensing parameter for a sense circuit based on the threshold voltage of the first transistor; and applying the at least one sensing parameter to the sense circuit during a sense operation.

In an embodiment, the at least one sensing parameter comprises a voltage applied to the sense circuit during a portion of a precharge period. In an embodiment, the at least one sensing parameter comprises a voltage applied to the sense circuit to deboost the sense node. In an embodiment, the at least one sensing parameter comprises a length of a develop time between a coupling of the second transistor to a data line and a decoupling of the second transistor from the data line. In an embodiment, a method further comprises determining a digital code representing the threshold voltage of the first transistor and generating the at least one sensing parameter for the sense circuit based on the digital code. In an embodiment, the memory cell is a NAND flash memory cell. In an embodiment, the first transistor is a P type field effect transistor to sense the data state of the memory cell. In an embodiment, the sense circuit comprises a capacitor having a first end coupled to the sense node and a second node coupled to an adjustable bias voltage. In an embodiment, the at least one sensing parameter comprises a first voltage applied to the sense circuit over a first period of time and a second voltage applied to the sense circuit over a second period of time. In an embodiment, the tracking circuit comprises a voltage divider to generate a sense parameter of the at least one sense parameter. In an embodiment, the at least one sense parameter is generated for a plurality of sense circuits. In an embodiment, a method further comprises reconfiguring the tracking circuit to generate an additional sense parameter for the sense circuit. In an embodiment, a system comprises means to perform any of the above methods. In an embodiment, the means comprise machine-readable code that when executed, cause a machine to perform one or more steps of the methods. In an embodiment, the system further comprises a battery communicatively coupled to a processor, a display communicatively coupled to the processor, or a network interface communicatively coupled to the processor.

In at least one embodiment, a non-transitory machine readable storage medium having instructions stored thereon, the instructions when executed by a machine to cause the machine to sense a threshold voltage of a first transistor, the first transistor tracking a threshold voltage of a second transistor selectively coupled to a memory cell of the memory array via a data line; generate at least one sensing parameter for the sense circuit based on the threshold voltage of the first transistor; and apply the at least one sensing parameter to the sense circuit during a sense operation.

In an embodiment, the at least one sensing parameter comprises a voltage applied to the sense circuit during a portion of a precharge period. In an embodiment, the at least one sensing parameter comprises a voltage applied to the sense circuit to deboost the sense node. In an embodiment, the at least one sensing parameter comprises a length of a develop time between a coupling of the second transistor to a data line and a decoupling of the second transistor from the data line. In an embodiment, the instructions when executed further cause the machine to determine a digital code representing the threshold voltage of the first transistor and generate the at least one sensing parameter for the sense circuit based on the digital code.

In at least one embodiment, a system comprises a host computing device comprising a processor, the host computing device to send read commands to a storage device; and a storage device comprising at least one memory array, a sense circuit, and a tracking circuit; wherein the storage device is to sense a threshold voltage of a first transistor, the first transistor tracking a threshold voltage of a second transistor selectively coupled to a memory cell of the memory array via a data line; generate at least one sensing parameter for the sense circuit based on the threshold voltage of the first transistor; and apply the at least one sensing parameter to the sense circuit during a sense operation.

In an embodiment, the at least one sensing parameter comprises a voltage applied to the sense circuit during a portion of a precharge period. In an embodiment, the at least one sensing parameter comprises a voltage applied to the sense circuit to deboost the sense node. In an embodiment, the at least one sensing parameter comprises a length of a develop time between a coupling of the second transistor to a data line and a decoupling of the second transistor from the data line. In an embodiment, the storage device is further to determine a digital code representing the threshold voltage of the first transistor and generate the at least one sensing parameter for the sense circuit based on the digital code.

In at least one embodiment, a system comprises means to sense a threshold voltage of a first transistor, the first transistor tracking a threshold voltage of a second transistor selectively coupled to a memory cell of the memory array via a data line; means to generate at least one sensing parameter for the sense circuit based on the threshold voltage of the first transistor; and means to apply the at least one sensing parameter to the sense circuit during a sense operation.

In an embodiment, the at least one sensing parameter comprises a voltage applied to the sense circuit during a portion of a precharge period. In an embodiment, the at least one sensing parameter comprises a voltage applied to the sense circuit to deboost the sense node. In an embodiment, the at least one sensing parameter comprises a length of a develop time between a coupling of the second transistor to a data line and a decoupling of the second transistor from the data line. In an embodiment, the system further comprises means to determine a digital code representing the threshold voltage of the first transistor and generate the at least one sensing parameter for the sense circuit based on the digital code.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a memory array;
   a sense circuit comprising:
      a first transistor; and
      a sense node coupled to a gate of the first transistor and selectively coupled to a memory cell of the memory array via a data line; and
   a tracking circuit comprising a second transistor having a threshold voltage that is to track a threshold voltage of the first transistor, the tracking circuit to generate at least one sensing parameter of the sense circuit based on the threshold voltage of the second transistor.

2. The apparatus of claim 1, wherein the memory cell is a NAND flash memory cell.

3. The apparatus of claim 1, wherein the first transistor is a P type field effect transistor to sense a data state of the memory cell.

4. The apparatus of claim 1, the sense circuit further comprising a capacitor having a first node coupled to the sense node and a second node coupled to an adjustable bias voltage.

5. The apparatus of claim 1, wherein the at least one sensing parameter comprises a voltage applied to the sense circuit during a portion of a precharge period.

6. The apparatus of claim 1, wherein the at least one sensing parameter comprises a voltage applied to the sense circuit to deboost the sense node.

7. The apparatus of claim 1, wherein the at least one sensing parameter comprises a first voltage applied to the sense circuit over a first period of time and a second voltage applied to the sense circuit over a second period of time.

8. The apparatus of claim 1, the tracking circuit further to determine a digital code representing the threshold voltage of the second transistor and to generate the at least one sensing parameter of the sense circuit based on the digital code.

9. The apparatus of claim 1, wherein the at least one sensing parameter comprises a length of a develop time between a coupling of the sense node to the data line and a decoupling of the sense node from the data line.

10. The apparatus of claim 1, the tracking circuit further comprising a voltage divider to generate a sense parameter of the at least one sense parameter.

11. A method comprising:
   sensing, by a tracking circuit, a threshold voltage of a first transistor, the first transistor tracking a threshold voltage of a second transistor, wherein a gate of the second transistor is selectively coupled to a memory cell of a memory array via a data line;

generating, by the tracking circuit, at least one sensing parameter for a sense circuit based on the threshold voltage of the first transistor; and applying the at least one sensing parameter to the sense circuit during a sense operation.

12. The method of claim 11, wherein the at least one sensing parameter comprises a voltage applied to the sense circuit during a portion of a precharge period.

13. The method of claim 11, wherein the at least one sensing parameter comprises a voltage applied to the sense circuit to deboost a sense node.

14. The method of claim 11, wherein the at least one sensing parameter comprises a length of a develop time between a coupling of the second transistor to a data line and a decoupling of the second transistor from the data line.

15. The method of claim 11, further comprising determining a digital code representing the threshold voltage of the first transistor and generating the at least one sensing parameter for the sense circuit based on the digital code.

16. A system comprising:
 a host computing device comprising a processor, the host computing device to send read commands to a storage device; and
 a storage device comprising at least one memory array, a sense circuit, and a tracking circuit;
 wherein the storage device is to:
  sense a threshold voltage of a first transistor, the first transistor tracking a threshold voltage of a second transistor, wherein a gate of the second transistor is selectively coupled to a memory cell of the memory array via a data line;
  generate at least one sensing parameter for the sense circuit based on the threshold voltage of the first transistor; and
  apply the at least one sensing parameter to the sense circuit during a sense operation.

17. The system of claim 16, wherein the at least one sensing parameter comprises a voltage applied to the sense circuit during a portion of a precharge period.

18. The system of claim 16, wherein the at least one sensing parameter comprises a voltage applied to the sense circuit to deboost a sense node.

19. The system of claim 16, wherein the at least one sensing parameter comprises a length of a develop time between a coupling of the second transistor to a data line and a decoupling of the second transistor from the data line.

20. The system of claim 16, wherein the storage device is further to determine a digital code representing the threshold voltage of the first transistor and generate the at least one sensing parameter for the sense circuit based on the digital code.

21. The apparatus of claim 1, the sense circuit further comprising a capacitor having a first node coupled to the sense node and a second node coupled to an adjustable bias voltage, wherein the at least one sensing parameter comprises a voltage applied, after a sense node develop time between a coupling of the sense node to the data line and a decoupling of the sense node from the data line has elapsed, by the adjustable bias voltage to the second node of the capacitor to deboost the sense node.

* * * * *